(12) United States Patent
Ogawa et al.

(10) Patent No.: US 12,449,825 B2
(45) Date of Patent: *Oct. 21, 2025

(54) GAS SUPPLY CONTROL DEVICE

(71) Applicant: Hitachi High-Tech Corporation, Tokyo (JP)

(72) Inventors: Yoshifumi Ogawa, Tokyo (JP); Yutaka Kouzuma, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 119 days.

This patent is subject to a terminal disclaimer.

(21) Appl. No.: 17/642,324

(22) PCT Filed: Mar. 29, 2021

(86) PCT No.: PCT/JP2021/013349
§ 371 (c)(1),
(2) Date: Mar. 11, 2022

(87) PCT Pub. No.: WO2022/208621
PCT Pub. Date: Oct. 6, 2022

(65) Prior Publication Data
US 2024/0111313 A1    Apr. 4, 2024

(51) Int. Cl.
*G05D 7/06* (2006.01)
*F16K 31/06* (2006.01)
(Continued)

(52) U.S. Cl.
CPC ....... *G05D 7/0652* (2013.01); *F16K 31/0603* (2013.01); *F16K 37/005* (2013.01); *H01L 21/67017* (2013.01)

(58) Field of Classification Search
None
See application file for complete search history.

(56) References Cited

U.S. PATENT DOCUMENTS

| 5,605,179 A | 2/1997 | Strong, Jr. et al. |
| 9,297,374 B2 | 3/2016 | Braggin et al. |

(Continued)

FOREIGN PATENT DOCUMENTS

| CN | 101276732 A | 10/2008 |
| CN | 106029214 A | 10/2016 |

(Continued)

OTHER PUBLICATIONS

Machine Translation of JP200222770A published Aug. 9, 2002. (Year: 2002).*

(Continued)

*Primary Examiner* — Sylvia Macarthur
(74) *Attorney, Agent, or Firm* — Miles & Stockbridge, P.C.

(57) ABSTRACT

A gas supply control device that supplies a gas to a processing chamber in which a workpiece is processed, includes: a first port connected to a gas source of a purge gas; a second port to which a gas source of a processing gas is connected; a collective pipe in which each of the purge gas and the processing gas supplied from the first port and the second port merges, respectively, and flow; a first flow rate controller provided between the first port and the collective pipe; and a second flow rate controller provided between the second port and the collective pipe. A gas flow path through which the purge gas flows is provided from an output side of the first flow rate controller to an input side of the second flow rate controller.

11 Claims, 8 Drawing Sheets

(51) Int. Cl.
*F16K 37/00* (2006.01)
*H01L 21/67* (2006.01)

(56) References Cited

U.S. PATENT DOCUMENTS

| | | | |
|---|---|---|---|
| 9,653,357 | B2 | 5/2017 | Arami et al. |
| 9,841,770 | B2 | 12/2017 | Hirata et al. |
| 2003/0192608 | A1 | 10/2003 | Otsuki et al. |
| 2003/0212507 | A1* | 11/2003 | Wei .................. C23C 16/52 |
| | | | 702/45 |
| 2005/0087299 | A1 | 4/2005 | Okabe et al. |
| 2006/0076060 | A1 | 4/2006 | Ohmi et al. |
| 2006/0096533 | A1 | 5/2006 | Mochizuki et al. |
| 2009/0170332 | A1 | 7/2009 | Komiyama et al. |
| 2009/0232985 | A1* | 9/2009 | Dussarrat ............ H01L 21/0228 |
| | | | 427/255.28 |
| 2010/0145633 | A1 | 6/2010 | Yasuda |
| 2011/0121217 | A1 | 5/2011 | Ohmi et al. |
| 2012/0222751 | A1* | 9/2012 | Okabe ............... H01L 21/67017 |
| | | | 137/376 |
| 2014/0137961 | A1 | 5/2014 | Kao et al. |
| 2014/0299201 | A1 | 10/2014 | Hirose et al. |
| 2016/0379857 | A1* | 12/2016 | Ogawa ................ H01L 21/3065 |
| | | | 137/587 |
| 2019/0080888 | A1* | 3/2019 | Ikenaga ............ H01L 21/67109 |
| 2020/0006079 | A1* | 1/2020 | Miyoshi ............ H01J 37/32449 |
| 2024/0055278 | A1* | 2/2024 | Ogawa ................ F16K 31/126 |
| 2024/0111313 | A1* | 4/2024 | Ogawa .................... F15B 11/06 |

FOREIGN PATENT DOCUMENTS

| | | |
|---|---|---|
| CN | 207122639 U | 3/2018 |
| JP | H03115663 U | 11/1991 |
| JP | H06077234 U | 10/1994 |
| JP | 2001-029386 A | 5/2001 |
| JP | 2002-222770 A | 8/2002 |
| JP | 2004-183743 A | 7/2004 |
| JP | 2004264881 A | 9/2004 |
| JP | 2008-069918 A | 3/2008 |
| JP | 2008-159905 A | 7/2008 |
| JP | 2008-533731 A | 8/2008 |
| WO | 2006097525 A1 | 9/2006 |
| WO | 2008069227 A1 | 6/2008 |
| WO | 2009122683 A1 | 10/2009 |
| WO | 2013046660 A1 | 4/2013 |
| WO | 2016121075 A1 | 8/2016 |
| WO | 2022168301 A1 | 8/2022 |

OTHER PUBLICATIONS

Search Report mailed May 25, 2021 in International Application No. PCT/JP2021/013349.
Written Opinion mailed May 25, 2021 in International Application No. PCT/JP2021/013349.
Search Report mailed Apr. 6, 2021 in International Application No. PCT/JP2021/004546.
Written Opinion mailed Apr. 6, 2021 in International Application No. PCT/JP2021/004546.
Office Action mailed Mar. 14, 2025 in Chinese Application No. 202180004762.7.
Office Action mailed Oct. 29, 2024 in U.S. Appl. No. 17/762,821.
Notice of Allowance mailed Mar. 24, 2025 in U.S. Appl. No. 17/762,821.

* cited by examiner

GAS SUPPLY CONTROL DEVICE

TECHNICAL FIELD

The present invention relates to a gas supply control device. The present invention particularly relates to a gas supply control device that is connected to a surface treatment apparatus that treats a workpiece by use of gases such as etching, CVD (chemical vapor deposition), ashing, and surface modification, for controlling a flow or a flow path of gas to the surface treatment apparatus.

BACKGROUND ART

For example, in the manufacture of electrical components such as semiconductor devices, liquid crystal devices, solar cells, MEMS, and measuring instruments thereof, and micromechanical parts, a surface treatment apparatus that treats a surface of a workpiece material such as wafers by use of high-purity process gases having various gas characteristics is now an indispensable and important industrial machine in the world. The surface treatment apparatus can also be rephrased as a semiconductor manufacturing apparatus, a substrate processing apparatus, a plasma processing apparatus, or a vacuum processing apparatus.

In these surface treatment apparatuses, the supply of a process gas is controlled according to the processing information of each step of the set processing recipe. The gas flow rate is controlled by using a thermal sensor type mass flow rate controller (MASS FLOW RATE CONTROLLER, hereinafter referred to as MFC) or a pressure flow rate controller (PRESSURE FLOW RATE CONTROLLER, hereinafter referred to as PFC). The supply and stop of the process gas is controlled by controlling the opening and closing of gas valves located before and after the flow rate controller. A single process gas or a mixed gas in which a mixing ratio of the single process gas and another process gas is controlled by the gas flow rate is introduced into a processing chamber or reaction reactor (hereinafter referred to as the chamber) in which a workpiece is housed. The single process gas or mixed gas introduced into the chamber may be further mixed with other process gases in the chamber.

The gas introduced into the chamber is supplied from a customer's building-side supply equipment to the surface treatment apparatus through a connection point. On the surface treatment apparatus side, usually, multiple gases are introduced into a gas accumulation valve, and the mixed gas is supplied through a flow rate control device (also referred to as a flow rate controller). In the case of gases that cannot be mixed in a pipe, for example, a combustible gas and a flammable gas are collected in separate accumulation valves. The gas is supplied between a collective pipe outlet (mixed gas formed) of each accumulation value and the chamber by a separate pipe. Each individually supplied mixed gas is to be mixed for the first time in the chamber.

A pressure in a vacuum state where the safety of the chamber can be ensured is maintained and monitored so that even if the gas introduced into the chamber reacts and causes an explosion, for example, a pressure in the chamber does not exceed the atmospheric pressure after the reaction, in other words, the chamber is not destroyed. This allows the operation of the surface treatment apparatus to be managed.

Those accumulation valves are housed in a gas box or a housing exhaustible box, which is called an MFC unit, so that an operator does not suck a leaked gas in even in the unlikely event of a gas leak.

Normally, in the accumulation valve connected to the surface treatment apparatus, a gasket filter (for protecting equipment against foreign matters through a pipe), a manual hand valve (used for lockout (block) when the gas supply is stopped), a supply gas pressure detector (which may not be attached), and a supply source valve (air operated valve) are connected toward the downstream (chamber supply side) between the position of an upstream gas supply port (port) to which the process gas is supplied and a gas input side of the flow rate controller. The gas output side of the flow rate controller is connected to the collective pipe through a downstream valve (air operated valve). The gas that has been controlled in flow rate from each gas supply system becomes a mixed gas in the collective pipe, and the mixed gas is supplied from the gas box to the chamber through the collective pipe.

In the gas pulse supply (a technique for cyclically switching gas), the gas flowing out of the flow rate controller may be divided into two collective pipes, one of which may be connected to the chamber to carry out the process exhaustible. The gas from the other collective pipe may be connected to an exhaust system so that the gas from the other collective pipe is directly discarded (does not contribute to the processing of the workpiece).

CITATION LIST

Patent Literature

PTL 1: International Publication No. 2013/0466660
PTL 2: International Application No. PCT/JP2021/004546
PTL 3: International Publication No. 2008/069227
PTL 4: Japanese Unexamined Patent Application Publication No. 2004-264881
PTL 5: International Publication No. 2016/121075

SUMMARY OF INVENTION

Technical Problem

PTL 1 discloses that for the purpose of further downsizing the gas supply line and the gas device and facilitating maintenance and management of each device, a combination system having an array stacked in parallel is used to compactly form the accumulation valve. However, the above configuration does not correspond to the handling of gases that cannot flow at the same time and the pulsed gas supply that requires gas disposal in the exhaust. Further, in the above accumulation gas supply device, the process gas is circulated in the order of an inlet on-off valve 1, a three-way switching on-off valve 2, a flow rate controller 3, and an outlet on-off valve 5, and multiple gas supply lines S into which a purge gas is allowed to flow through the three-way switching on-off valve 2 are disposed in parallel. When the inlet side on-off valve 1 is closed to perform gas purging, a dead space exists on the upstream side of the purge gas. If the gas liquefies in the dead space, purging cannot be efficiently performed.

Further, PTL 2 schematically shows the configuration of a supply line of a process gas (treatment gas). In the above configuration, a collective pipe that collects the gas to be supplied to the chamber and a collective pipe that collects the gas which is discarded directly to the exhaust system and is not allowed to come into contact with the workpiece are provided separately, and the process gas is allowed to flow toward a diaphragm side from an opposite side of the diaphragm. On the other hand, the purge gas (gas for purging) is allowed to flow from the diaphragm side toward the opposite side of the diaphragm. Furthermore, when the chamber supply of the process gas has been stopped, the purge gas from the upstream side promptly pushes out the process gas without dead volume, thereby suppressing the outflow of gas, which is advantageous in gas pulse (cyclic gas switching). The gases that cannot flow together in the same gas pipe are supplied to each supply block in which the gases that can flow at the same time without any problem are bundled.

However, in the gas supply with such a configuration, when foreign matters may flow into the gas supply system for some reason, a specific gas line may be mixed with other gas due to a malfunction on a building side, a device stops for a fixed period due to the addition of equipment or the like, or the gas is liquefied in the pipe as described above, it is necessary to purge the gas before and after the gas flow rate controller with a low-reactivity gas such as argon (hereinafter referred to as Ar) gas or nitrogen (hereinafter referred to as N2) gas. After the gas in question has been completely and surely discharged, the gas supply may be restored by purging with Ar gas or N2 gas, or in some cases, parts replacement by opening the air to the atmosphere may be required. Further, a function for checking (flow rate calibration) the controllability of the flow rate controller of the process gas is required.

However, PTL 2 does not have a structure capable of such purging, and does not disclose a check of controllability (flow rate calibration).

Speaking of flow rate calibration, PTL 3 discloses an example in which an evaluation target flow rate control device and a reference flow rate control device are disposed in series in this order from the upstream on a flow path through which a fluid a flow rate of which is to be controlled flows. The evaluation target flow rate control device is set to a flow rate uncontrolled state where the valve is almost fully opened, and the flow rate of the fluid is controlled to a predetermined flow rate by the reference flow rate control device. In this state, it is determined whether or not the measured flow rate by the evaluation target flow rate control device falls within a predetermined range of the measured flow rate by the reference flow rate control device. The purpose of the flow rate control device is to measure or predict the flow rate and control the flow rate correctly. With the above calibration method, it can be determined whether or not the flow rate measurement is correct, but there is a problem that it cannot be determined whether or not a drive unit such as a valve that can control the flow rate correctly operates normally.

In particular, the difficulty of controlling the flow rate with hydrogen fluoride (hereinafter referred to as HF) gas can be found in PTL 4. The higher the pressure and the lower the temperature, the more continuous HF becomes in a row due to the electrical polarity of gas molecules, and clusters are formed to provide different gas properties. Therefore, the flow rate measurement after HF has been made monatomic to stabilize the properties of the gas becomes an issue. In the flow rate monitoring system of PTL 3, since the measurement is performed by increasing the pressure, there is a problem that clusters are easily formed and the measurement becomes inaccurate especially when the flow rate is relatively large.

Further, as in PTL 2, PTL 5 discloses a method in which a normally closed air operated valve is used for controlling the process gas, and a three-position stop solenoid valve is used for controlling gas valves that cannot be opened at the same time, and each gas valve is prevented from opening at the same time. However, in PTL 5, a use method of the accumulation valve, and other applications are not clear. Safety standards such as SEMI (Semiconductor Equipment and Materials International) require that, for example, one error does not lead to a serious failure or disaster. In the conventional accumulation valve, in the system of the process gas to which the pipe is not connected or the process gas not used in the device is locked out by a manual valve provided at a place where the process gas enters the accumulation valve so that care has been taken to minimize an influence even when the gas valve is unintentionally opened. In addition, some valve manufacturers may be developing valves with manual valves (manual valves are prioritized) that can be controlled to open and close even with air operation. However, if a problem such as an internal leak (internal leak that gas cannot be partitioned) has occurred in the manual valve (manual valve) itself, one error of the manual valve causes serious accidents which lead to a gas leak during chamber maintenance or parts replacement. This problem is also expected to improve.

One of issues of the present invention is to provide a gas supply control device capable of purging a gas before and after a flow rate controller of a processing gas.

Other issues and novel features will become apparent from the description and accompanying drawings herein.

Solution to Problem

An outline of a typical example of the present invention will be described below in brief.

According to an embodiment, there is provided a gas supply control device that supplies a gas to a processing chamber in which a workpiece is processed, including: a first port connected to a gas source of a purge gas; a second port to which a gas source of a processing gas is connected; a collective pipe in which each of the purge gas and the processing gas supplied from the first port and the second port merges, respectively, and flow; a first flow rate controller provided between the first port and the collective pipe; and a second flow rate controller provided between the second port and the collective pipe. A gas flow path through which the purge gas flows is provided from an output side of the first flow rate controller to an input side of the second flow rate controller.

Advantageous Effects of Invention

According to the gas supply control device according to the embodiment, gas purging before and after the second flow rate controller can be performed.

DESCRIPTION OF EMBODIMENTS

Figure 1:
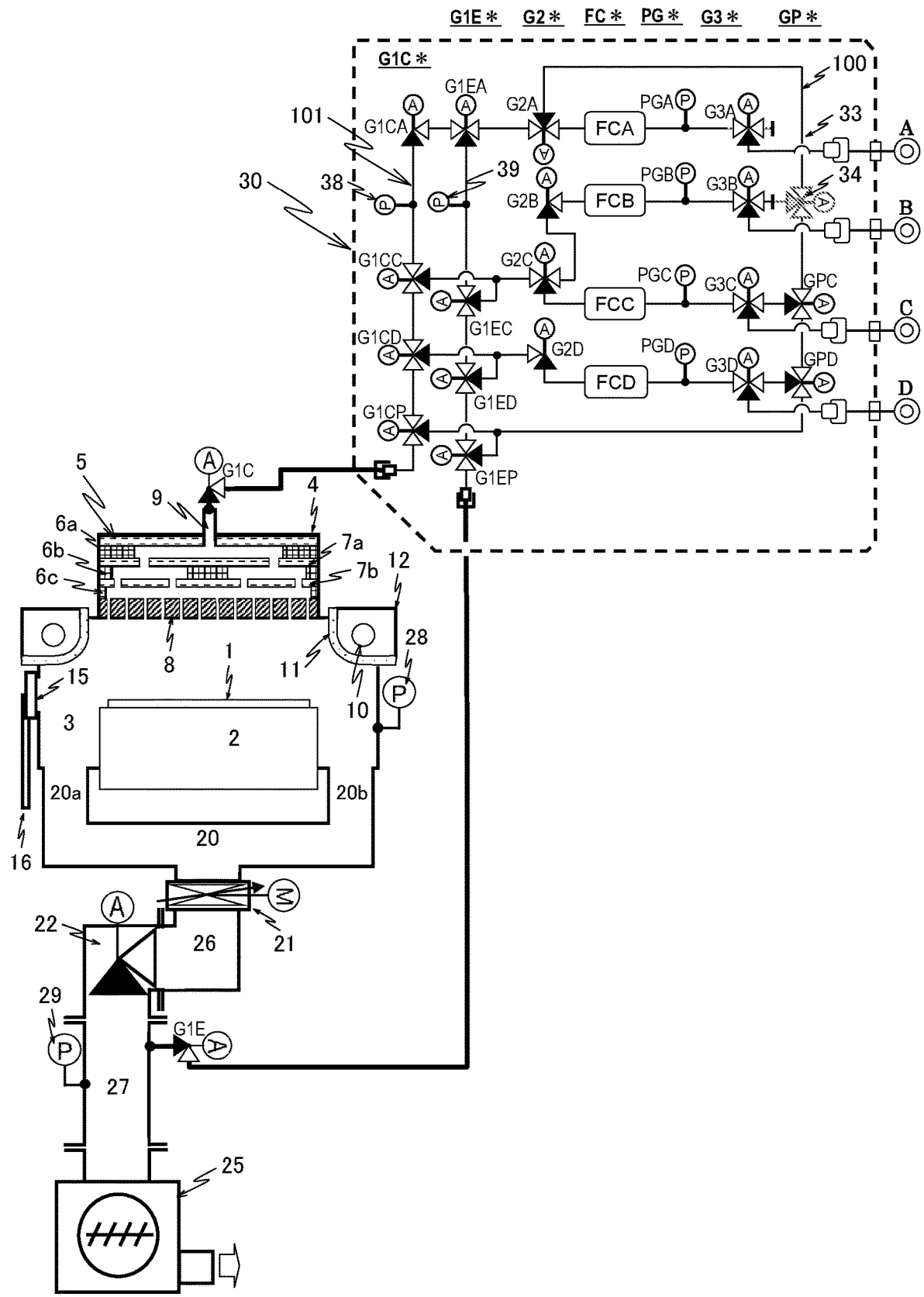
FIG. 1 is a diagram showing a configuration example of a surface treatment apparatus and a gas supply control device according to an embodiment of the present invention.

Hereinafter, examples and embodiments will be described with reference to the drawings. However, in the following description, the same components may be designated by the same reference numerals and repetitive description may be omitted. It should be noted that the drawings may be represented schematically as compared with actual embodiments in order to clarify the description, but the drawings are merely examples and do not limit the interpretation of the present invention.

In order to overcome the problems of the prior art, the present embodiment has the following configuration.

First, in the installation of a gas purge on process gas line, there is provided a gas path (gas flow path, purge gas line) that bypasses a gas discharged from a downstream side (outlet side) of a flow rate controller in a gas flow rate system of a purge gas at a most upstream position of a collective pipe, and introduces the gas from the most upstream side of the process gas line. In other words, a gas path for introducing the purge gas is connected to the upstream side (input side) of the flow rate controller in the gas flow rate system of the process gas, and the purge gas can be introduced from the most upstream side of the process gas line. In order to efficiently purge and expel the process gas without leaving the process gas in the process gas line, the process gas must be purged from the upstream side. However, the process gas of the process gas line needs to be guided to a gas valve at the back downstream of the purge gas line, which can be solved by grade separation considering a structure of the valve and a configuration of a base member.

In a flow rate calibration process of the flow rate controller flow rate of the process gas such as HF, a standard gas (Ar gas or $N_2$ gas used for purging gas) that has been conventionally used is used for purging, and the flow rate controller is fully opened and used as a flow rate monitor. The flow rate controller of the process gas located downstream is operated and the flow rate controller is calibrated by determining whether or not the flow rate controller of the process gas performs an appropriate control by the flow rate monitor of the standard gas flowing in a series. In other words, the flow rate controller of the process gas is calibrated by comparing the flow rate measurement value of the flow rate controller of the purge gas with the flow rate control value of the flow rate controller of the process gas. With the above process, the correctness of both the flow rate monitor and the flow rate control can be confirmed.

Incidentally, a multimeric gas containing multiple molecules, such as a cluster of an HF gas, may show a viscosity difference that cannot be ignored, which is significantly different from the viscosity when a standard gas is heated. Further, in the case of an MFC, since the degree of freedom of the molecule differs between the multimer gas and a simple substance gas, a difference in thermal conductivity occurs and the controlled flow rate further fluctuates. However, the flow rate controller may be controlled to a temperature and pressure that can be controlled so that the gas can be kept as a single unit, based on the supply of the HF gas as a single unit by increasing a temperature and reducing a control pressure. Therefore, since both the standard gas and the process gas are controlled by the gas single unit without the temperature difference, the calibration can be performed only by using the gas conversion factor at the temperature confirmed in advance.

Furthermore, in a problem that an error of one manual valve may cause a serious accident, the manual valve itself has been abolished. Instead, in order to take advantage of manual operation, a manual air switching valve (mechanical valve) that cuts off the air supply to a process gas supply air operated valve of the accumulation valve of the process gas is built into an outer wall of a gas box so that the air supply to an air operated valve for taking the accumulation valve can be cut off and closed. A sensor that is of a lockout compatible type and can detect that the air operated valve has been manually turned off (close) is provided. Upon the detection of a close signal, control solenoid valves of the downstream air operated valve at an outlet of the MFC connected to the gas pipe and the air operated valve for purging are electrically turned off (close), and those two air operated valves are turned off without the air supply under control. Therefore, two valves of the air operated valve for process gas supply and the air operated valve on the downstream side of the outlet of the MFC are closed to the downstream side so that the air does not leak to the downstream side, and two valves of the air operated valve for process gas supply and the air operated valve for purging are closed so that the air does not leak to the purge gas line side, thus performing double shutout. Even if one air operated valve fails (internal leak), the other air operated valve can be closed so that serious accidents and malfunctions can be avoided.

Naturally, if any gas valve itself controlled by the mechanical valve fails and needs to be replaced, a manual valve on a customer side, which is provided on a gas supply line on the customer side separately from the mechanical valve operated on the outer wall of the gas box is closed, and if necessary, the supply from the gas source is cut off for replacement work. This is the same as the case of replacing the manual hand valve installed in the gas line in the conventional configuration, and there is no difference from the conventional replacement work.

According to the present invention, the following one or more effects can be obtained.

1) With leveraging of the purge gas line of the collective pipe, the purge gas can be supplied upstream of each process gas more compactly without increasing the amount of equipment.
2) Since the purge gas of each process gas is supplied from the most upstream of each process gas supply line, the process gas can be purged without a dead volume. The purging process of gas that is likely to be liquefied in the dead volume can be performed, and a time required for gas purging can be shortened.
3) The flow rate for calibration of the flow rate controller of the process gas can be measured with the purge gas as the standard gas under the temperature and pressure conditions close to the actual use conditions.
4) The manual gas valve installed on the process gas line can be abolished to make a total length of the accumulation valve shorter and more compact, and the operation of closing the supply gas in accordance with the safety guidelines of the SEMI requirements can be performed.

Hereinafter, each example of the present invention will be described with reference to FIGS. 1 to 7.

EXAMPLES

The configuration of a gas supply control device for controlling a gas flow and a flow path according to the present example will be described. FIG. 1 is a diagram showing a configuration example of a surface treatment apparatus and a gas supply control device according to an example. A process processing device (not shown as a whole), which is a surface treatment apparatus connected to a gas supply control device, houses a stage 2 on which a workpiece 1 is mounted and includes a chamber (reactor, processing room, etc.) 3 isolated from the atmosphere. A gas dispersion chamber (sub chamber) 4 is provided above the chamber 3 facing the stage 2, and a top plate 5, spacers 6a, 6b, and 6c, gas dispersion plates 7a and 7b, and a shower plate 8 are provided inside the gas dispersion chamber 4. A halogen lamp 10 is provided on the atmosphere side as a source of infrared light so as to orbit diagonally above the chamber 3, and the generated infrared light can be irradiated to the inside of the chamber 3 including the workpiece 1 through a transmission window 11. A gate valve 15 for carrying in and out the workpiece 1 is attached to a side wall of the chamber 3. The gate valve itself is also housed in a vacuum chamber of another transport chamber (not shown), and a system is configured so that, in a normal process processing, the chamber 3 is prevented from becoming an atmosphere each time the workpiece 1 is carried in and out, and prevented from being affected by the residual atmospheric components.

A gas inside the chamber 3 is collected in an exhaust pipe 20 on a back surface side of the stage 2 from multiple exhaust ports 20a, 20b, etc. from the chamber 3 so that the gas is evenly exhausted to the periphery of the workpiece 1. The gas collected in the exhaust pipe 20 reaches a main valve 22 after an exhaust speed has been adjusted by a pressure adjusting valve 21. The main valve 22 opens to provide an exhaust passage during the process processing, transportation of the workpiece 1, and an idling state waiting for the workpiece 1 to be charged. When the chamber 3 is opened to the atmosphere for cleaning of the inside of the chamber 3, parts replacement, and maintenance, the main valve 22 is closed. A dry pump 25 is connected to the downstream of the main valve 22 to exhaust gas. The exhaust gas of the dry pump 25 is further detoxified by an exhaust gas treatment device or the like (not shown) and then released into the atmosphere. A pressure inside the chamber 3 and a pressure of an exhaust pipe 27 connecting the main valve 22 and the dry pump 25 are monitored by pressure gauges 28 and 29, respectively. In this figure, a device for process processing by exhaust by the dry pump 25 is shown, but the gas supply unit of the present invention can be used without any change even when other exhaust units, a turbo molecular pump, or when multiple pumps are provided in parallel.

A portion 30 surrounded by a broken line on the right side of FIG. 1 is a gas box used as a gas supply control device. The gas box 30 includes multiple solenoid valves that control the opening and closing of an air operated valve (not shown), a detection function at the time of gas leakage, an outside air intake port, a function of exhausting the housing with a duct at the time of gas leakage, a function of always monitoring a negative pressure (gas exhausted) in an internal space of the gas box 30, and components for monitoring. Further, a limit switch may be provided on a lid (not shown) that is opened during maintenance of the gas box 30 to access the inside of the gas box 30, in other words, the removal of the lid may be monitored to shut out the gas flow path may be carried out under control. In the internal configuration of the gas box 30 in FIG. 1, only element parts that come into direct contact with the process gas are illustrated. The double circle indicates a gas source supplied from a building other than the process device, and the gas ports of the gas source are named A to D from a top of the figure.

In the present example, the gas box 30 is formed of one accumulation valve because gases that can flow at the same time without any problem are used. If there are gas types that cannot flow together, another accumulation valve is prepared to form the same configuration as in FIG. 1, and the collective pipe reaching the chamber and the exhaust system is also provided individually. The gases that cannot flow together are mixed for the first time at the positions of the chamber 3, the gas dispersion chamber 4, or the exhaust pipe 27. For example, when the above configuration is configured by the accumulation valve of a combustible gas and the accumulation value of a combustible gas to supply the gas to the process processing device, the pressures are monitored by the pressure gauges 28 and 29 so as not to exceed the atmospheric pressure when the respective gases are completely burned (react). If the pressure exceeds a monitoring pressure, all the gas valves are closed for safety.

Specifically, when the gas names of each A to D port are described, A is Ar gas, B is Ar gas, C is HF gas, and D is oxygen (hereinafter referred to as $O_2$) gas. In the present example, those four systems of gases are used, but if there is a gas that can flow at the same time, a gas system to be further supplied in parallel may be added. In this figure, an A line is the Ar gas for purging, and a B line is the Ar gas that dilutes the HF gas of a C line.

For the gas valve used in the gas box 30, a normally closed (spring return) type air driven diaphragm valve is used, but even if a bellows valve in which a drive shaft is sealed with a bellows and a valve body is provided at the tip may be used, there is nothing different in the content of the present invention.

The process gas introduced into the gas box 30 from the gas source (double circle) on the right side of the figure passes through a gas valve indicated by G3* (note that * is inserted with the names A to D of each gas system), and is guided to the accumulation valve. A small pressure gauge indicated by PG* is provided between the gas valve G3* and the flow rate controller (denoted by FC*). The pressure gauge PG* is used to monitor the gas supply pressure and determine the completion of vacuum exhaust. Each process gas whose flow rate is controlled by the flow rate controller FC* is guided to a gas valve G2* indicated on the downstream side. Each process gas can be discharged through a gas valve G1C* on a line toward the chamber 3 or a gas valve G1E* on a line toward the exhaust system as a waste gas.

Example of Configuration of Gas Purge of Process Gas Line

A gas valve G2A on the A line of the gas box 30 in FIG. 1 is closed during the process processing, but the inlet and outlet are always in communication on the diaphragm side (indicated by a white triangle Δ), and the gas valve G2A communicates with a downstream gas valve G1EA and a diaphragm side of a gas valve G1CA regardless of opening and closing of the gas valve G2A. A gas pipe (gas flow path, purge gas line) 100 on an opposite side of the diaphragm (indicated by a black triangle ▲) where the purge gas flows out when the gas valve G2A opens is guided to the most upstream side (right side of the figure) of the A to D lines, and guided to the uppermost stream of each line on the diaphragm side of the gas valve GP*. A free port 33 corresponding to a position of the gas valve GPA on the A line has no valve, but a free port 34 corresponding to a position of the gas valve GPB on the B line can take the same configuration as the other C line and D line. Therefore, the gas valve is shown in gray. At the positions of the free port 33 and the free port 34, a sealing plug structure that is actually replaced with a gas valve for passing the purge gas is built as will be described later. A gas pipe at the outlet on the diaphragm side of the valve GPD is connected to a collective pipe of an exhaust system line through a waste gas valve G1EP to the exhaust system of the purge gas line 100, and is also connected to a collective pipe 101 of the chamber 3 supply through a waste gas valve G1CP to the chamber 3 of the purge gas line 100. The presence of the gas valve G1EP and the gas valve G1CP enables the exhaust of the purge line 100 for the vacuum exhaust and the residual gas discharge of the purge gas line 100.

In other words, the gas supply control device 30 includes an A port (first port) that is connected to the gas source of the purge gas, a C port (second port) that is connected to the gas source of the processing gas, a collective pipe 101 that is connected to the processing chamber 3, and through which each of the purge gas and the processing gas supplied from the A port and the C port merges and flows, a flow rate controller (first flow rate controller) FCA that is connected between the A port and the collective pipe 101, and a flow rate controller (second flow rate controller) FCC that is connected between the C port and the collective pipe 101. A gas flow path 100 through which the purge gas flows is provided from the output side of the flow rate controller FCA to the input side of the flow rate controller FCC. In FIG. 1, the gas flow path 100 is connected between the gas valve G2A connected to the output side of the flow rate controller FCA and the gas valve GPC connected to the input side of the flow rate controller FCC and between the gas valve G2A and the gas valve GPD connected to the input side of the flow rate controller FCD.

(Procedure for Calibration of Flow Rate Controller)

Next, a procedure for calibrating each flow rate controller in the above accumulation valve will be described. As an example, the flow rate calibration of the process gas of the C line will be described. All the gas supply valves are closed, the main valve 22 is open and the chamber 3 is exhausted, and each part is controlled in temperature (managed in temperature) so that heaters (not shown) have the same temperature as during the actual process processing. If the temperature is heated higher than a steady state (the process processing can start at any time simply in a vacuum exhaust of the chamber 3) due to the operation of a discharge part (not attached in this example) or infrared irradiation by the halogen lamp 10, it is desirable to wait for a temperature close to the steady state (within ±10° C.) according to cooling temperature data acquired in advance before starting. Calibration starts from this state.

First, the main valve 22 is closed and the gas valve G3C is closed to cut off the supply of the actual process gas. The gas valves G1E, G1EC, and G2C are opened, a constant adjusted flow rate is set for the flow rate controller (second flow rate controller) FCC, the pressure of the pressure gauge PGC is set to zero (vacuum), and pipes and valves, and it is confirmed that the actual process gas (HF gas) of the C line remaining in the flow rate controller is discharged to the exhaust system. Once confirmed, the gas valve G1E is left to be open and all those open gas valves G1EC and G2C are closed once.

Next, the gas valve G1EP is opened, the gas valves G2A and G3A are opened, a flow rate is set for the flow rate controller (first flow rate controller) FCA, and it is confirmed that the purge gas (Ar gas) of the A line flows in the purge gas line 100 without any problem. After confirmation, the gas valves G1E and G1EP are closed. Next, the main valve 22 is opened to exhaust the chamber 3, the gas valves G1C, G1CC, G2C, and GPC are opened so that the purge gas (Ar gas) of the A line can be supplied to the flow rate controller FCC through the purge gas line 100.

For calibration, the control flow rate of the flow rate controller FCA is maximized and used as a gas flow rate monitor, and the flow rate of the actually flowing purge gas (Ar) of the A line is monitored by the flow rate controller FCA while the gas flow rate is continuously changed by the flow rate controller FCC at multiple points or in an analog manner in order from a minimum gas flow rate to a maximum gas flow rate.

With the above test, the flow rate controller FCC can continuously and normally control the flow rate, and the occurrence of failures over time and a change in gas sensitivity can be known by use of a gas conversion factor (acquired under a temperature controlled by the flow rate controller FCC in advance) of the purge gas on the A line and the process gas on the C line to correct a correct flow rate and perform the calibration.

In the case of the accumulation valve that requires a diluted gas as in this example, a valve is also provided at the position of the free port 34 on the B line of the diluted gas, and a purge gas (Ar gas or $N_2$ gas), which is a standard gas, is introduced. Then, in this case, a standard gas is introduced into the series of the flow rate controller FCA and the flow rate controller FCB and used for confirming whether or not the flow rate controllers FCA and FCB control each other correctly.

After measuring the flow rate, the gas valve GPC is first closed, it is confirmed with the pressure gauge PGC that the purge gas of the A line in the pipe has been discharged, the gas valves G2C, G1CC, and G1C are closed, and the valve state returns to the steady state. After that, the gas valve G3C on the C line may be opened and a space before and after the flow rate controller FCC may be filled with the process gas in advance. Further, the gas valve G1C in the final stage for supplying the gas to the chamber 3 is closed in the steady state, but may be controlled to open in a steady state for the operation of the process processing device.

Basically, while considering the gas conversion factor, even when the maximum flow rate of the flow rate controller FCC is reached, a flow rate larger than that flow rate can be monitored by the flow rate controller FCA. This is not the case if there is no need to cover an entire gas flow rate control area of the flow rate controller FCC (if the flow rate controller FCC may have a flow rate area that cannot be measured).

Figure 2:
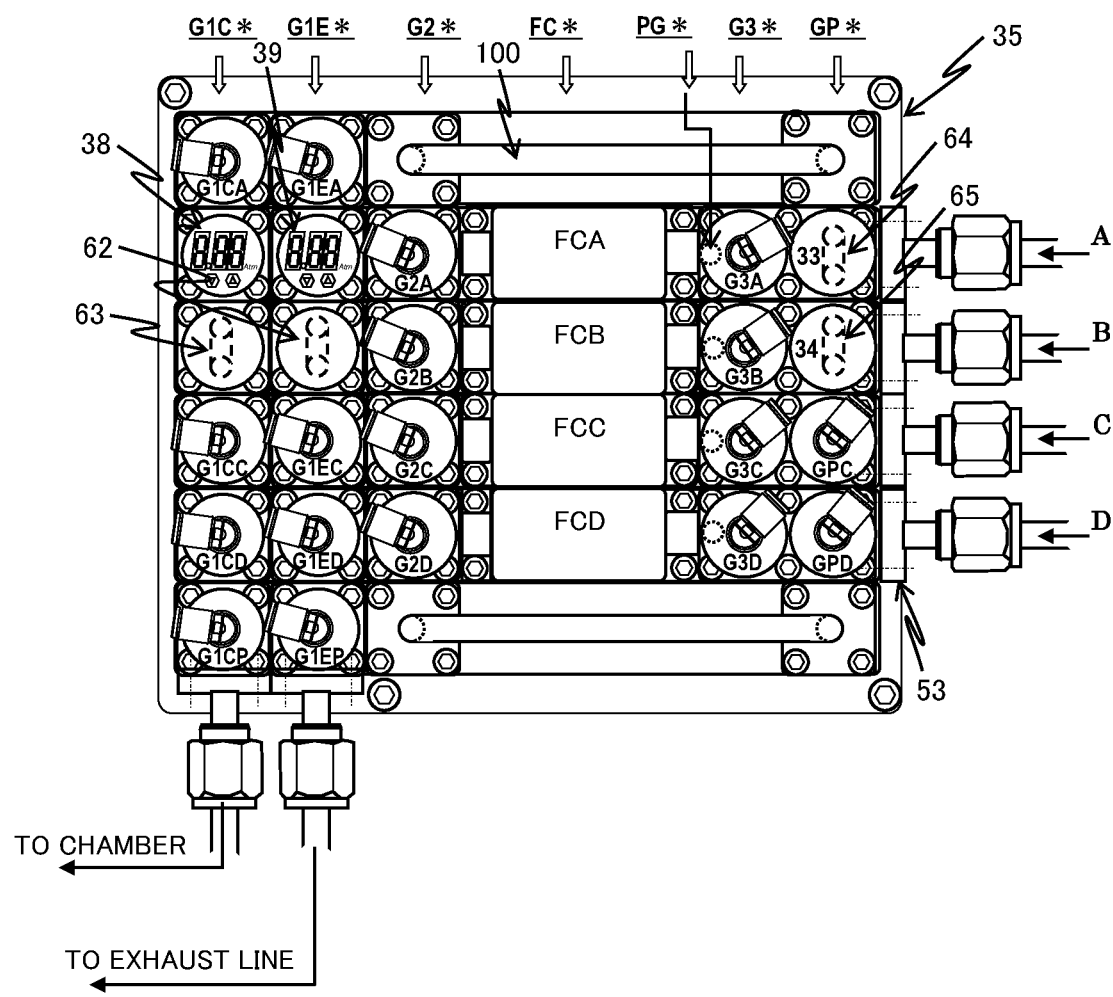
FIG. 2 is an external view showing a gas accumulation valve of the gas supply control device in FIG. 1.

FIG. 2 shows an external view of the gas box 30 shown in FIG. 1 as an accumulation valve. In FIG. 2, an air pipe for driving the gas valve of each air operated valve and an electric power and electric signal electric wires required for the flow rate controller are omitted without being shown. Each device is mounted on the base 35 to which the device for each accumulation valve is mounted according to the standard of the accumulation valve. In addition, in order to facilitate the identification of individual devices, some devices are directly numbered. The pressure gauge 38 that monitors the pressure of the collective pipe (101 in FIG. 1) that supplies the gas to the chamber 3 side and the pressure gauge 39 that monitors the pressure of the collective pipe that supplies the gas to be discarded to the exhaust pipe side are also disposed on the base of the accumulation valve. A small pressure gauge PG* is installed at a position indicated by an arrow extending from the PG* downstream of the gas valve G3*. Sealing plugs 62 and 63 are attached to the downstream ports of the pressure gauge 38 and the pressure gauge 39, which have no attached equipment, to allow the gas of the collective pipe to pass instead of the equipment. However, even if a regulatory block for merely communicating the top and bottom thereof directly is attached, or a through-hole is provided at the base 35 side, there is no change in the present invention.

In FIG. 2, the purge gas line 100 to which the purge gas is supplied is provided between the upper unit of the gas valve G2C and the upper unit of the free port 33. Similarly, the free ports 33 and 34 where no mounting equipment exists are at the gas valve positions (the position of GPC and GPD) on the upstream side of the purge gas line 100, but in order to form a passage through which the purge gas penetrates, the sealing plugs 64 and 65 are installed in place of the gas valves similarly.

Figure 3A:
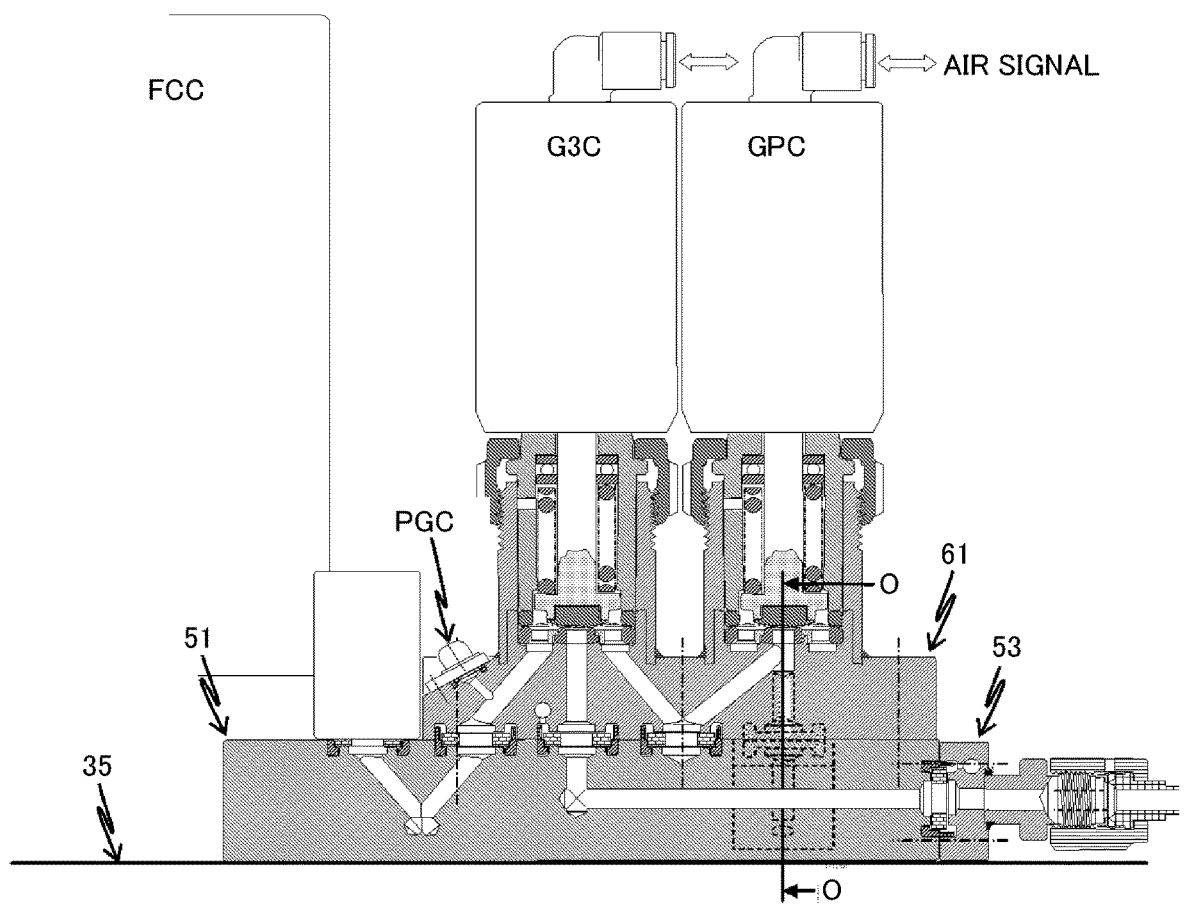
FIG. 3A is a cross-sectional view of a process gas line in the present invention.

FIG. 3A is a cross-sectional view of the process gas line in the present invention. FIG. 3A shows a vertical cross section on the upstream side of taking the process gas (HF gas) of the C line into the unit of the accumulation valve. The air pipe and electrical wiring, and the internal cross sections of the valve air drive unit and the flow rate controller FCC, and the subsequent units are omitted. According to this example, the lower base member 51 forming the gas path is attached to the base 35. Equipment for controlling the gas is attached to the upper part of the base member 51. Further, a joint 53 is provided on the right side of this figure, and the joint 53 serves as a connection point with the supply pipe on the customer side. The joint on the customer side is described, but the upstream pipe is omitted. The connection point is provided inside the gas box 30, and when a leak occurs from the joint 53, the gas can be safely discharged from the housing exhaust port (not shown) of the gas box 30 without touching a person.

On the upper part of the base member 51, a double four-way valve 61 in which two gas valves GPC and G3C are disposed from the right side of this figure is provided. The four-way means two ways of the inlet and outlet of the purge gas for the diaphragm side of the gas valve GPC, the process gas inlet supplied to the opposite side of the diaphragm of the gas valve G3C, and the outlet toward the downstream flow rate controller FCC, that is, means that those two valves access in four directions in total.

Figure 3B:
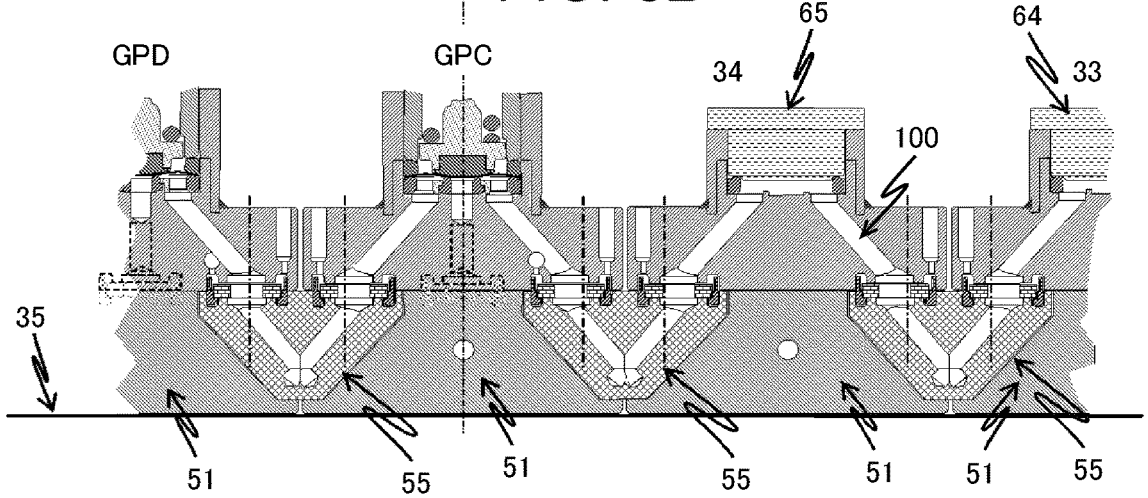
FIG. 3B is a cross-sectional view of a purge line as seen from a symbol O in FIG. 3A.

FIG. 3B shows a cross-sectional view of the purge gas line as seen from a symbol O in FIG. 3A. The purge gas line 100 is provided so as to penetrate the free ports 33 and 34 and be connected to the gas valves GPC and GPD. The purge gas communicating with the free port 33 and the free port 34 through the purge gas line 100 is introduced into the diaphragm side of the gas valve GPC. The gas valve GPC has a passage on the outlet side formed on the diaphragm side, and communicates with the input side on the diaphragm side of the gas valve GPD. When a valve body of the gas valve GPC rises and the diaphragm of the gas valve GPC opens, the passage can communicate with the opposite side of the diaphragm of the gas valve GPC and allow the purge gas to flow to the diaphragm side of the gas valve G3C. Similarly, when the valve body of the gas valve GPD rises and the diaphragm of the gas valve GPD opens, the passage can communicate with the opposite side of the diaphragm of the gas valve GPD and allow the purge gas to flow to the diaphragm side of the gas valve G3D. As a result, the purge gas can be supplied to the input side of the flow rate controllers FCC and FCD, so that gas can be purged before and after the flow rate controllers FCC and FCD (input side and output side of the flow rate controller).

In the configuration example shown in FIGS. 3A and 3B, a block 55 extends across the base member 51 of the adjacent gas system lines is fitted to form a path of the purge gas line 100 which is a bypass gas line of the purge gas. However, there is no change in the present invention even with other methods or other block shapes for the purpose of forming the path.

Figure 4A:
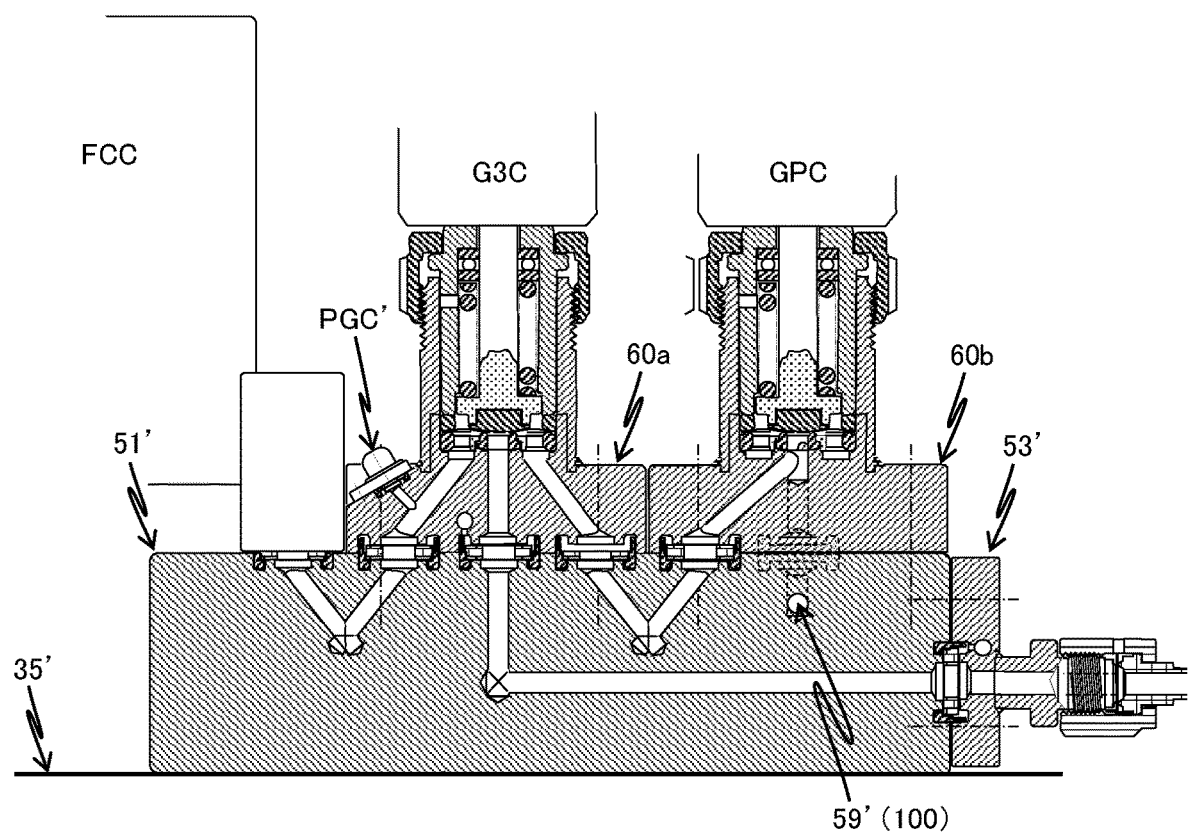
FIG. 4A is a cross-sectional view of a process gas line according to another embodiment.
Figure 4B:
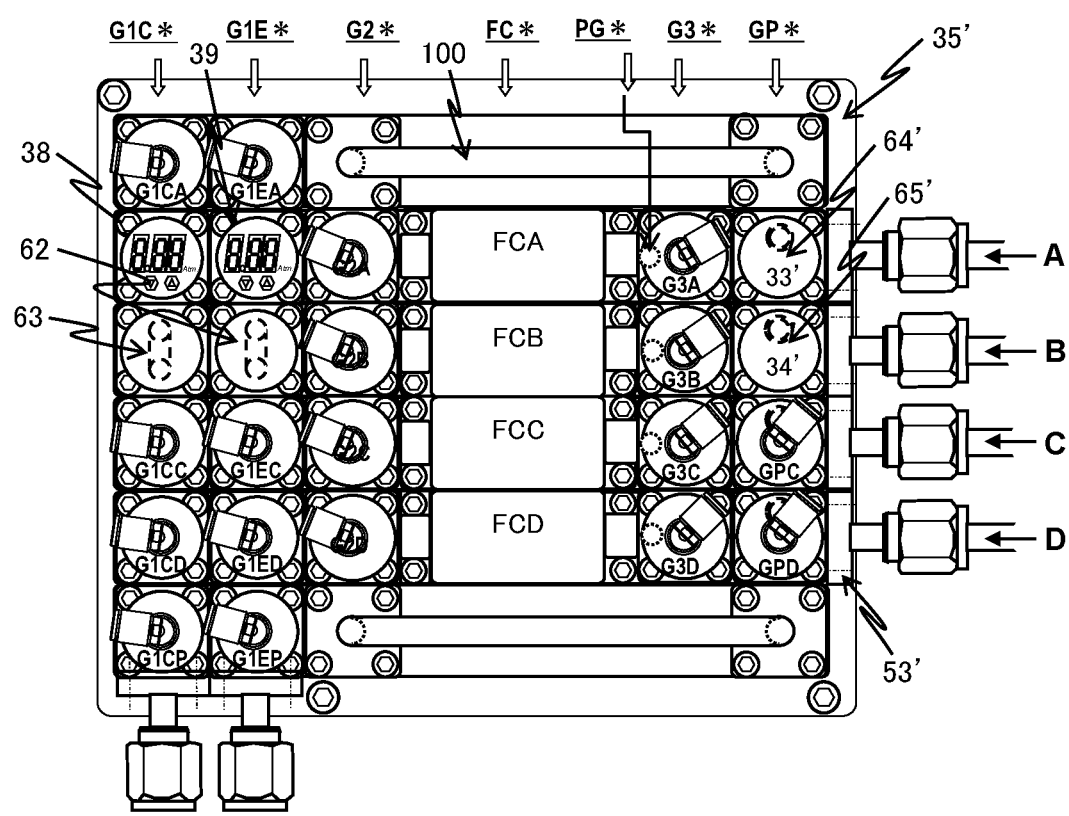
FIG. 4B is an external view of an accumulation valve according to another embodiment.

A cross-sectional view and an external view of configuring a purge gas line according to another embodiment will be described with reference to FIGS. 4A and 4B. FIG. 4A is a cross-sectional view of a process gas line according to another embodiment. FIG. 4B is an external view of an accumulation valve according to another embodiment. A purge gas line 100 is formed by a gas hole 59' that penetrates a block 51' that is integrally installed across an upstream portion of each gas system, and the gas hole 59' is connected to upper gas valves GPC and GPD and free ports 33' and 34'. The free ports 33' and 34' are sealed with sealing plugs 64' and 65', respectively. In the gas valves GPC and GPD, the gas hole 59' communicates to the diaphragm side of the gas valves GPC and GPD through the valve base 60*b*. Each of the gas valve G3* on the opposite side of the diaphragm communicates with the A to D ports through the valve base 60*a* and the block 51'. Each of the gas valves G3C and G3D on the diaphragm side communicates with the diaphragm side of the gas valves GPC and GPD through the valve base 60*a*, the block 51', and the valve base 60*b*.

When the gas valves GPC and GPD are driven and opened, the purge gas supplied to the gas hole 59' can flow to the opposite side of the diaphragm of the gas valves GPC and GPD. The purge gas (Ar gas) that has flowed out to the opposite side of the diaphragm of the gas valves GPC and GPD can flow to the diaphragm side of the downstream gas valves G3C and G3D through the block 51'.

As compared with the configuration example of FIGS. 3A and 3B, in the configuration example of FIGS. 4A and 4B, the accumulation valve is longer by about one fixing screw in order to provide the gas valves individually, and a flow path through which the purge gas flows between both the gas valves is provided in the block 51', and in order to avoid an interference with an introduction line of each process gas perpendicular to the flow path, the block 51' is raised (increased in a thickness direction), which is disadvantageous. However, gas valves (GPC, GPD) for purge gas are provided on the upstream side to supply the purge gas to the opposite side of the diaphragm of the gas valves (GPC, GPD), and the opposite side of the diaphragm of the gas valves (GPC, GPD) becomes a gas contact portion with the process gas (HF gas in the C port in this case). Thus, the component of the present invention is satisfied.

Figure 5A:
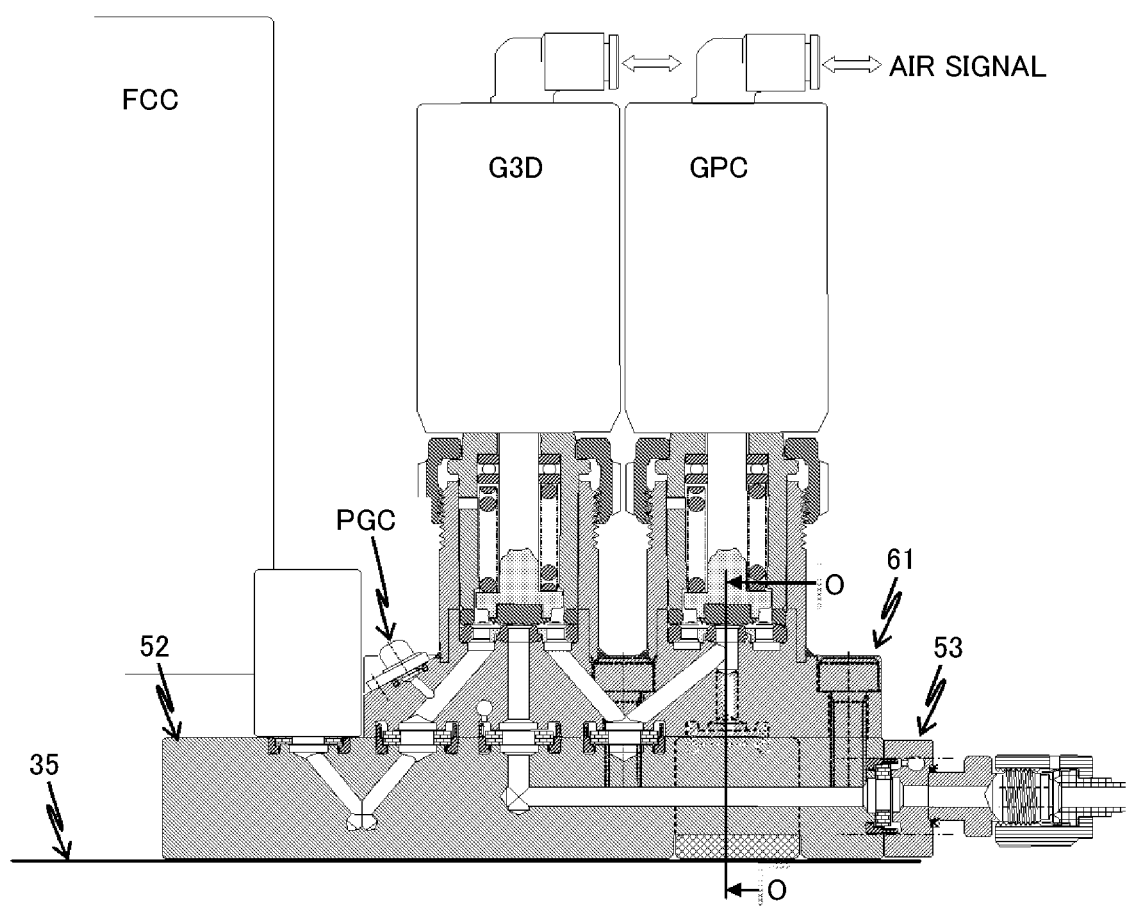
FIG. 5A is a cross-sectional view of a process gas line according to yet another embodiment.
Figure 5B:
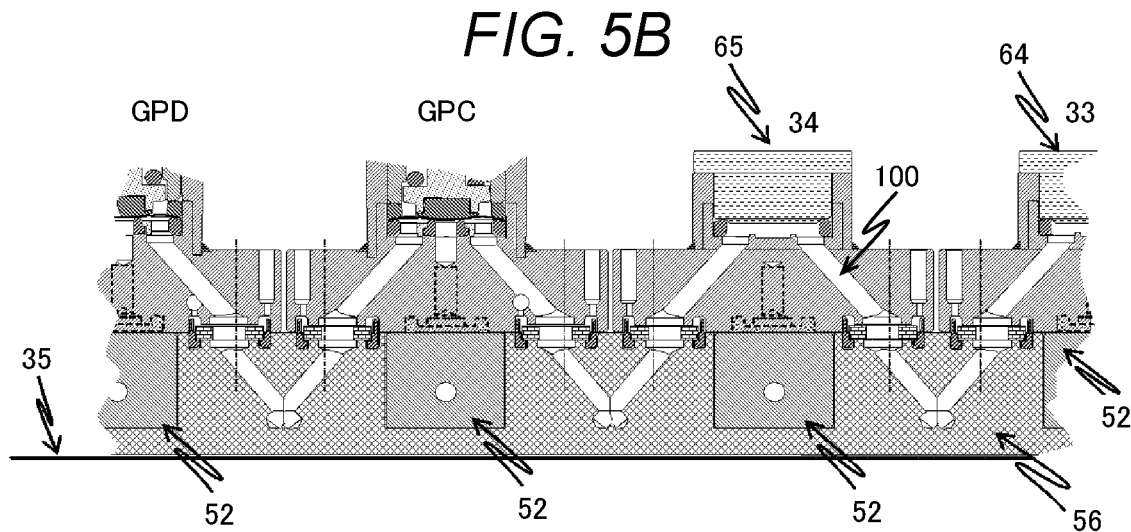
FIG. 5B is a cross-sectional view of a purge line as seen from a symbol O in FIG. 5A.

Next, a cross-sectional view and an external view for configuring a purge gas line according to still another embodiment will be described with reference to FIGS. 5A and 5B. FIG. 5A is a cross-sectional view of the process gas line according to still another embodiment. FIG. 5B is a cross-sectional view of the purge line as seen from a symbol O of FIG. 5A. A base 35, a joint 53, and a double four-way valve 61 shown in FIG. 5A are the same as those in FIG. 3A, and a repetitive description will be omitted. A purge gas line 100 is formed by a block 56 installed across each gas system, upper gas valves GPC and GPC, and free ports 33 and 34. A base member 52 of each gas system is narrowed in the cross section and is vertically embedded in a groove of the block 56. There is no seal structure for direct gas sealing between the block 56 and the base member 52 orthogonal to each other. However, because of sealing with the equipment, accuracy that does not cause a problem with temperature changes and impacts in a height direction can be ensured.

Figure 6:
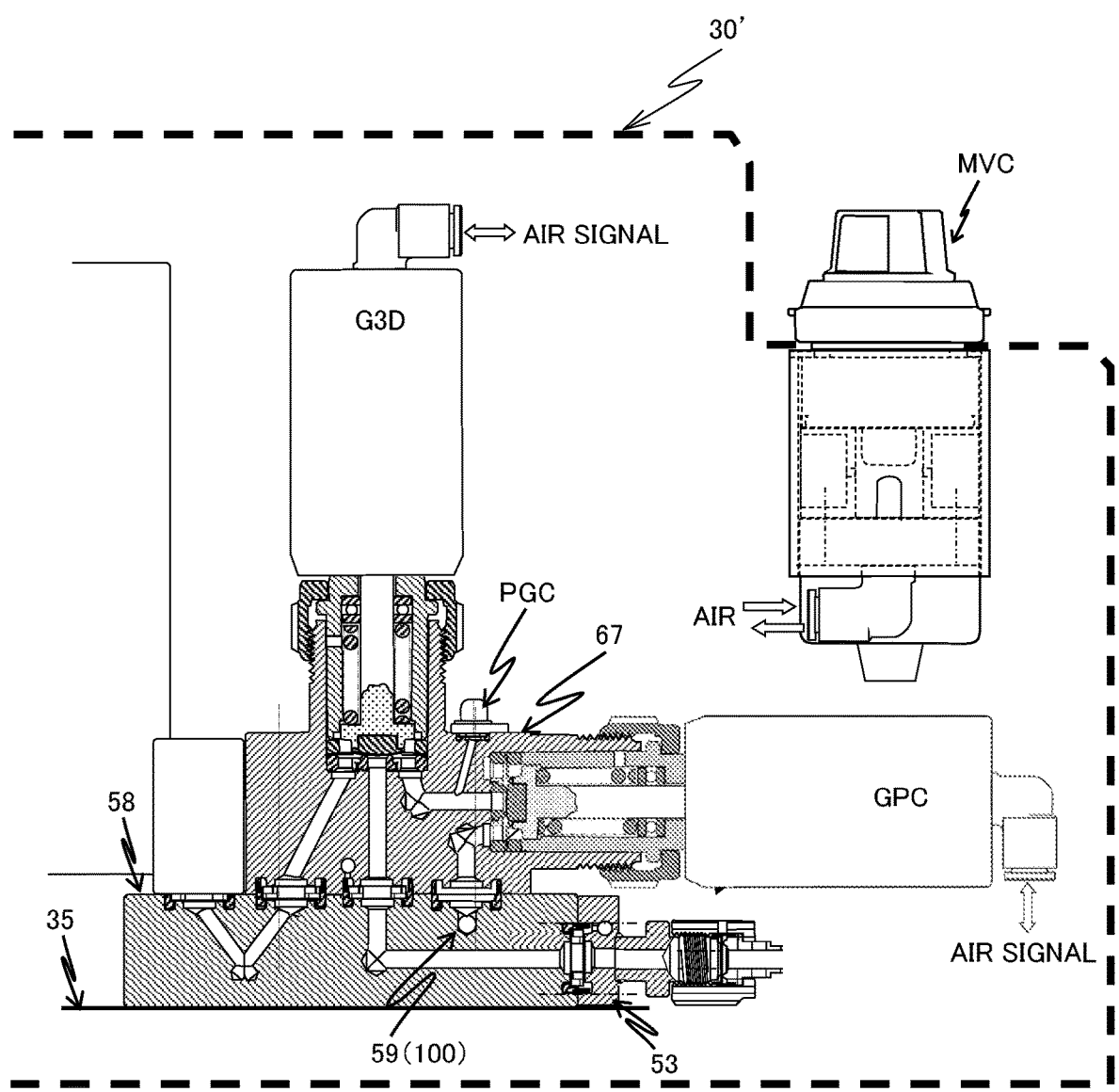
FIG. 6 is a cross-sectional view of a process gas line and a cross-sectional view of a purge line according to still another embodiment.

Still another embodiment of the present invention will be described with reference to FIG. 6. FIG. 6 is a cross-sectional view of a process gas line and a cross-sectional view of a purge according to still another embodiment.

In FIG. 6, instead of the double four-way valve 61 in FIG. 3A, a double three-way valve 67 whose seat surfaces are orthogonal to each other is used. This makes it possible to provide a configuration example in which the gas seal portion is reduced while shortening the pipe path. In this case, a pressure gauge PGC is installed in a pipe between gas valves GPC and G3D, which have the same space as the upstream pipe of a flow rate controller FCC. Further, a base member 58 is integrally provided across each gas system, and a gas hole 59 which is a flow path of the purge gas of the purge gas line 100 is orthogonal to the gas hole from each joint 53 which is a supply unit. Since the gas valve GPC provided on an upper part of the base member 58 accesses a gas hole 59 of the purge gas flow path 100 at only one place on the diaphragm side, the double three-way valve 67 reduced by one direction is used. MVC indicates a mechanical valve.

(Process Gas Flow)

Returning to FIG. 3, the flow of the process gas will be described. A process gas (C port system: HF gas) introduced from the joint 53 at the connection point passes through a lower part of the gas valve GPC and reaches an opposite side of the gas valve G3C. Upon receiving a signal to open the gas valve G3C by a gas supply command or a manual operation, a solenoid valve (not shown in FIG. 3) is driven to start supplying an air signal to the gas valve G3C. If a manual mechanical valve to be described later is open, the air reaches the gas valve G3C, a valve body of the gas valve G3C is raised, a diaphragm of the gas valve G3C is separated from a seat surface of the valve seat, and the process gas flows out to the diaphragm side of a gas valve G3D.

Upon receiving a signal to close the gas valve G3C by a command to a process end or a manual operation, a solenoid valve (not shown in FIG. 3) is turned off and the supply of the air signal to the gas valve G3C is stopped, and the gas is exhausted to the atmosphere. The drive air of the gas valve G3C is removed, the valve body of the gas valve G3C descends, the diaphragm of the gas valve G3C is pressed against the seat surface of the valve seat, and the process gas stops flowing out to the diaphragm side of the gas valve G3C.

(Gas Purge Method)

When all the process processing is interrupted, for example, the abovementioned calibration of the gas-controlled flow rate, the purging process of the gas line, or maintenance by opening to the atmosphere is required, the process gas remaining in the valve needs to be discharged. At that time, first, in a state where both gas valves G3D and GPC are kept closed, the gas valve corresponding to the exhaust path is opened from the downstream side to discharge the residual gas. An appropriate control flow rate is set in the flow rate controller FCC at that time. After confirming that a vacuum has been created by the pressure gauge PGC, the purge gas (Ar gas, etc.) flows from the gas flow rate controller FCA to the purge gas line 100 through the gas valve G2A. When the gas valve GPC is opened, the gas can be purged from the most upstream of the process gas C system, a dead volume is minimized, and the process gas can be discharged smoothly. After purging for a certain period of time, the residual process gas can be expelled by closing all the open gas valves.

Example of Gas Valve Control Configuration

Figure 7:
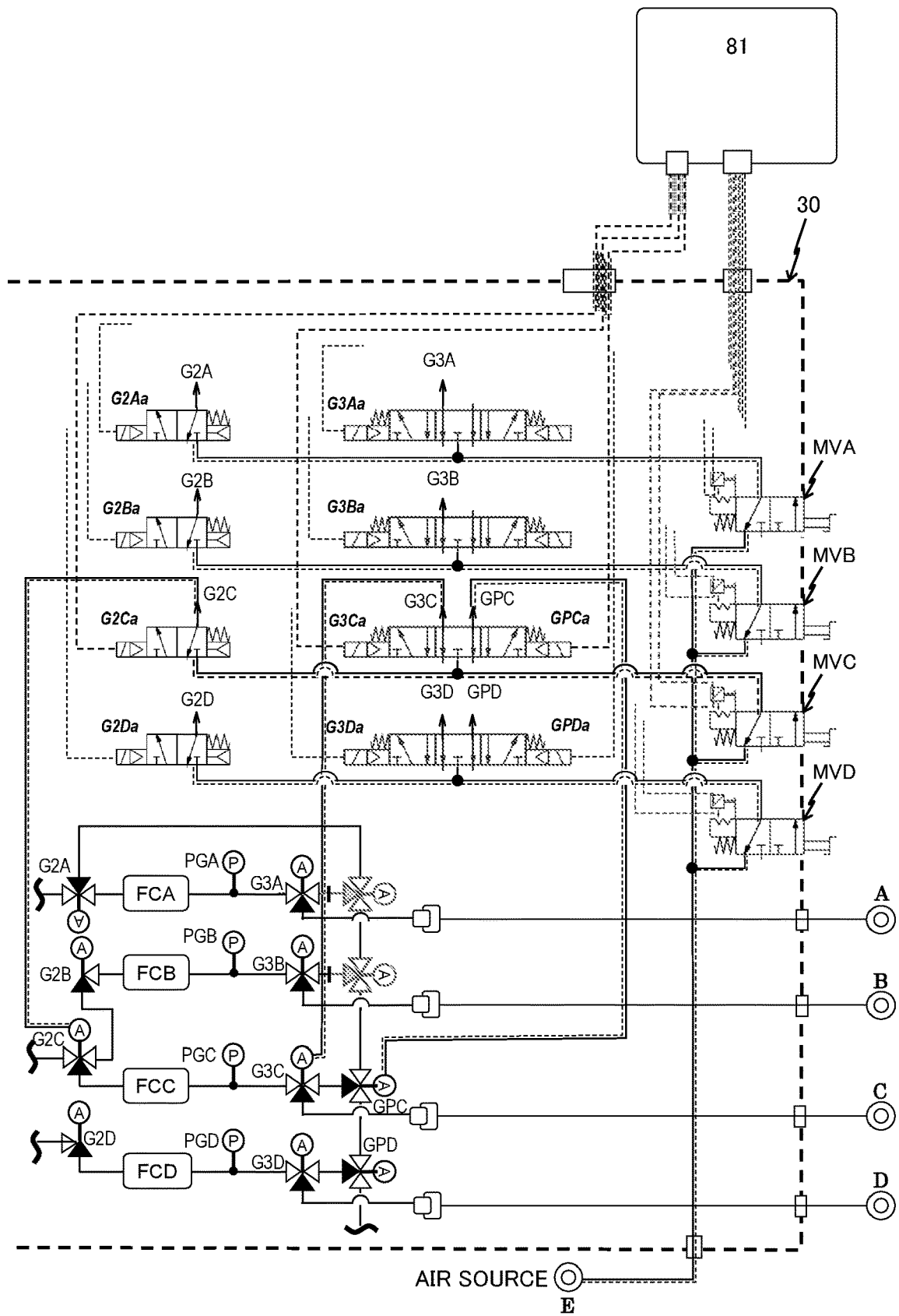
FIG. 7 is a block diagram of air control of a gas valve according to the present invention.

Next, a configuration example of air control of a gas valve will be described with reference to FIG. 7. FIG. 7 is a block diagram of the air control of the gas valve according to the present invention. FIG. 7 is a schematic diagram showing a configuration example of the valve control in an upstream portion of an accumulation valve according to the present invention. A controller (also referred to as a control unit or control device) 81 of the process processing device is a so-called controller that outputs an electric output in response to an electric input, and the controller 81 may be, for example, a PLC (Programmable Logic Controller) or a relay circuit. The controller 81 may further operate in cooperation with a higher-level controller or the like (not shown). In FIG. 7, air pipes are indicated by a double line with a broken line, electric signals are indicated by a broken line, and a purge gas pipe (an A port system gas pipe connected to an A port), a diluted gas pipe (a B port system gas pipe connected to a B port), and process gas pipes (a C port system gas pipe connected to a C port and a D port system gas pipe connected to a D port) are indicated by solid lines. Mechanical valves MVA, MVB, MVC, and MVD that control whether a gas inflow to the inside of the accumulation valve is allowed or not are provided for each A to D port gas pipe, and an air is supplied to each of the mechanical valves MVA, MVB, MVC, and MVD from a port to which an air source (Air source) is supplied. An operation part of a mechanical valve MV* is mounted so as to be capable of being operated from a surface of a gas box 30, and the lockout could be operated from the outside without opening the inside of the gas box 30 (see FIG. 6). The mechanical valve MV* (*: the names A to D of each gas system are inserted) normally allows the received air to pass therethrough as it is, but when the mechanical valve MV* is closed, a passage of the air is cut off, and the air remaining in the downstream pipe can be discharged into the gas box 30 exhausted from the housing. Further, a reed switch for detecting that the inflow of the process gas is stopped by operating the mechanical valve MV* is attached to the mechanical valve MV*, and its signal is taken into the controller 81. When the controller 81 receives an electric signal for stopping the inflow from the mechanical valve MV*, the controller 81 controls the electric signal not to be output to the solenoid valve for opening the related gas valve. This figure shows an actual connection state of the air pipes and electrical signal wirings for the C port system gas pipe (C system gas line) because the pipes, the air pipes, and electrical signal wirings are complicated and difficult to see. For other gas lines (A port gas pipe, B port gas pipe and D port gas pipe), the description of the air pipes and the wirings of the electric signals is omitted.

The mechanical valve MVC normally allows air to pass therethrough, and supplies the air required for the opening operation of the gas valves G3C and GPC to G3Ca, GPCa, and a three-position stop solenoid valve (normally exhaust type) with a solenoid pair described in italics, and supplies the air for opening the gas valve G2C to a three-port solenoid valve, which is also described as G2Ca in italics. In this state, when an open command, which is an electric signal for opening the gas valve G3C or the gas valve G2C, is output from the controller 81 (generation of the open command), the solenoid valve (G2Ca, G3Ca, and GPCa) side is connected, air is supplied to the gas valve G3C and the gas valve G2C, and the C port system process gas can flow downstream through the gas valve G3C, the flow rate controller FCC, and the gas valve G2C.

When an operation for shutting off air is performed in the mechanical valve MVC, the air supply to the downstream of the mechanical valve MVC is cut off, and the remaining air is discharged to the gas box 30. Further, the controller 81, which receives an electric signal indicating that the mechanical valve MVC is electrically cut off, controls an open command, which is an electric signal for exciting the solenoids G2Ca, G3Ca, and GPCa, not to be output (prohibition of open command).

The operation of the three-position stops solenoid valves (G3Aa, G3Ba, G3 Da, and GPD3) and the three-port solenoid valves (G2Aa, G2Ba, G2Da) is not described, but from the description of the solenoid valves (G2Ca, G3Ca, and GPCa) described above, those who are skilled in the art can easily understand the operation of the mechanical valves MVA, MVB, MVDC and the operation of the solenoid valves (G3Aa, G3Ba, G3 Da and GPD3, G2Aa, G2Ba, G2Da).

With the provision of the shutoff function, a double hard interlock can be formed which does not emit air, which is an energy source for opening the gas valves, and an electric signal for exciting the solenoids for forming a pneumatic control circuit. Even if the gas valve G3C for process gas bites a foreign substance on a seat surface of the diaphragm and an internal leak occurs, the frequency of the internal leaks caused by the gas valve G2C for process gas on the downstream side of the gas valve G3C and the gas valve GPC for process gas separated from the purge gas line at the same time is low, and therefore the control is safer.

In the examples of FIGS. 6 and 7, a reed switch is used to detect the cutoff of the mechanical valve MV*, but instead of the reed switch, a pressure switch that detects an air pressure is located at a position downstream of the air pipe of the mechanical valve MV* to detect the cutoff. This method also has no large difference in safe control.

Further, when an internal leak occurs in the gas valve G3C or the gas valve GPC, the internal leak can be detected because the pressure of the pressure gauge PGC does not reach the vacuum side even if the residual gas exhaust is evacuated. In particular, if the gas valve G3C leaks internally, the manual valve provided on a building side instead of the main gas box 30 is closed to discharge the residual gas including the connection point, and each gas path is purged with the purge gas. Thereafter, maintenance is performed by accessing the inside of the gas box 30, or the double four-way valve 61 or the double three-way valve 67 formed by the gas valve G3C and the gas valve GPC is replaced. This operation is the same as the treatment when an internal leak occurs in the hand valve placed on the conventional process gas line, and there is no change in the response method.

Further, in this example, a delivery destination of the air source supplied by the mechanical valve MV* is shown as the gas valves GP*, G3*, and G2*, but the gas valve G1E* and the gas valve G1C* may be added. This is because the collective pipe communicates with the diaphragm side of the gas valves G1E* and G1C* at the outlets of each of these process gas systems.

Although the invention made by the present inventors has been specifically described above based on examples and embodiments, it goes without saying that the present invention is not limited to the abovementioned examples and embodiments and can be variously modified.

REFERENCE SIGNS LIST

1: workpiece
2: stage
3: chamber (reactor, etc.)
4: gas dispersion room (secondary room)
5: top plate
6*a*, 6*b*, 6*c*: spacer
7*a*, 7*b*: gas dispersion plate
8: shower plate
9: nozzle
10: halogen lamp
11: transparent window
15: gate valve
16: gate valve drive shaft
20*a*, 20*b*: exhaust port
20: exhaust pipe
21: pressure control valve
22: main valve
25: dry pump
26: connection pipe
27: exhaust pipe
28: pressure gauge (for chamber)
29: pressure gauge (for exhaust pipe)
30: gas box
33: free port
34: free port
35: base
38: pressure gauge (flammable/chamber supply collective pipe)
39: pressure gauge (flammable/exhaust system waste gas collective pipe)
42: free port
43: free port
51: base member
52: base member
53: joint
55: block
56: block
58: base member
59, 59': gas hole
60*a*, 60*b*: valve base
61: double four-way valve
62, 63, 64, 65, 64', 65': sealing plug
67: double three-way valve
81: controller
100: purge gas line (gas flow path)
101: collective pipe
G3C, G3D: gas valve on the upstream side of a flow rate controller
PGA, PGB, PGC, PGD: pressure gauge
FCA, FCB, FCC, FCD: flow rate controller
G2A, G2B, G2C, G2D: gas valve on the downstream side of the flow rate controller
G1CA, G1CC, G1CD: gas valve on a line to the chamber
G1EA, G1EB, G1EC, G1CD: gas valve on a line to an exhaust system with waste gas
G1C: final-stage gas valve on the line to the chamber G1E: final-stage gas valve of the line to the exhaust system with waste gas
G1EP: waste gas valve to the exhaust system of the purge line
G1CP: waste gas valve to the chamber of the purge line

The invention claimed is:

1. A gas supply control device that supplies a gas to a processing chamber in which a workpiece is processed, comprising:
   a first port (A) that is connected to a gas source of a purge gas;
   a second port (C) to which a first gas source of a first processing gas is connected;
   a third port (D) to which a second gas source of a second processing gas is connected;
   a collective pipe that is connected to the processing chamber, and in which each of the purge gas and the first and second processing gases supplied from the first port, the second port, and the third port merges, respectively, and flows;
   a first flow rate controller (FCA) that is connected between the first port and the collective pipe;
   a second flow rate controller (FCC) that is connected between the second port and the collective pipe; and
   a third flow rate controller (FCD) that is connected between the third port and the collective pipe,
   wherein a gas flow path through which the purge gas flows is provided from an output side of the first flow rate controller and is connected to only an input side of the second flow rate controller, an input side of the third flow rate controller, and the collective pipe. (FIG. 1, item 100 [0059].

2. The gas supply control device according to claim 1, wherein the gas flow path is connected to the second flow rate controller (FCC) via a first gas valve (GPC) that is provided on a most upstream side between the second port (C) and the input side of the second flow rate controller to supply and stop the purge gas, and
   the first gas valve controls a flow direction of the purge gas from a diaphragm side to an opposite side of the diaphragm.

3. The gas supply control device according to claim 2, further comprising:
   a second gas valve (G3C) that is provided between the input side of the second flow rate controller (FCC) and the first gas valve (GPC),
   wherein the second gas valve (G3C) controls a flow direction of the processing gas from the opposite side of the diaphragm to the diaphragm side.

4. The gas supply control device according to claim 3, wherein the first gas valve and the second gas valve configure a double four-way valve.

5. The gas supply control device according to claim 3, wherein the first gas valve and the second gas valve configure a double three-way valve.

6. A gas supply control device that supplies a gas to a processing chamber in which a workpiece is processed, comprising:
   a first port;
   a second port;
   a third port;
   a collective pipe that is connected to the processing chamber, and in which a purge gas supplied from the first port and a processing gas supplied from the second port and a processing gas supplied from the second port merge and flow;
   a first flow rate controller that is connected between the first port and the collective pipe;
   a second flow rate controller that is connected between the second port and the collective pipe; and
   a third flow rate controller that is connected between the third port and the collective pipe; and
   a gas flow path that is provided from an output side of the first flow rate controller and is connected only to an input side of the second flow rate controller, an input side of the third flow rate controller, and the collective pipe,
   wherein when performing a flow rate calibration process of the second flow rate controller,
   the purge gas supplied from the first port sequentially flows to the first flow rate controller, the gas flow path, the second flow rate controller, the collective pipe, and the processing chamber,
   the flow rate is controlled by the second flow rate controller, and the first flow rate controller is used as a gas flow rate monitor, and
   a flow rate measurement value of the first flow rate controller is compared with a flow rate control value of the second flow rate controller.

7. The gas supply control device according to claim 6, wherein when performing a flow rate calibration process of the second flow rate controller, a temperature of the processing chamber and the gas supply control device is controlled to a temperature at which the processing gas is actually used.

8. A gas supply control device that supplies a gas to a processing chamber in which a workpiece is processed, comprising:
   a first port that is connected to a gas source of a processing gas;
   a second port that is connected to an air source;
   a third port that is connected to a gas source for a purge gas;
   a collective pipe that is connected to the processing chamber, and through which the processing gas supplied from the first port flows;
   a first flow rate controller that is connected between the first port and the collective pipe;
   a second flow rate controller that is connected between the third port and the collective pipe;
   a first gas valve that is connected between the first port and an input side of the flow rate controller;
   a second gas valve that is connected between the collective pipe and an output side of the flow rate controller;
   a third gas valve that is provided between the first port and the first gas valve and allows the purge gas supplied to the third port to flow into the input side of the flow rate controller;
   a solenoid valve that controls the opening and closing of the first gas valve and the second gas valve;
   a mechanical valve that is connected to the second port and controls the supply and stop of air necessary for opening the first gas valve and the second gas valve to the solenoid valve; and
   a controller that generates an open command to the solenoid valve,
   wherein the mechanical valve generates an electric signal when the supply of the air to the solenoid valve is stopped, and
   the controller prohibits the generation of the open command to the solenoid valve based on the electric signal, and wherein a gas flow path through which the purge gas flows is provided from an output side of the third flow rate controller and is connected to an input side of the first flow rate controller and the collective pipe.

9. The gas supply control device according to claim 8, wherein the mechanical valve includes a reed switch that generates the electric signal when the air supply is closed.

10. The gas supply control device according to claim 8, wherein the mechanical valve includes a pressure switch that monitors an air pressure downstream of the mechanical valve, and
the pressure switch generates the electric signal upon detecting that the air pressure has dropped.

11. The gas supply control device according to claim 8, wherein the solenoid valve controls the opening and closing of the first gas valve, the second gas valve, and the third gas valve.

\* \* \* \* \*